United States Patent [19]

Nakagomi

[11] 4,071,778

[45] Jan. 31, 1978

[54] ANALOG OPERATION CIRCUIT USING A MULTI-COLLECTOR LATERAL TRANSISTOR

[75] Inventor: Yoshiyuki Nakagomi, Kodaira, Japan

[73] Assignee: Hitachi, Ltd., Japan

[21] Appl. No.: 704,991

[22] Filed: July 13, 1976

[30] Foreign Application Priority Data

July 30, 1975 Japan .................................. 50-91915

[51] Int. Cl.$^2$ ......................... G06G 7/12; H01L 29/72

[52] U.S. Cl. ................................ 307/229; 307/299 B; 357/35; 357/36

[58] Field of Search .................... 357/35, 36; 307/229, 307/299 B

[56] References Cited

U.S. PATENT DOCUMENTS

| | | | |
|---|---|---|---|
| 3,725,683 | 4/1973 | Andersen | 307/299 B |
| 3,742,256 | 6/1973 | Frederiksen et al. | 307/299 B |
| 3,914,622 | 10/1975 | Pezzolo | 307/299 B |

OTHER PUBLICATIONS

"Nonsaturating Complementary Transistor Circuit," by Schuenemann et al., IBM Tech. Discl. Bull., vol. 13, No. 3, pp. 710–711.

*Primary Examiner*—Stanley D. Miller, Jr.
*Attorney, Agent, or Firm*—Craig & Antonelli

[57] ABSTRACT

An analog operation circuit using a lateral transistor element having an emitter region, a base region disposed adjacent to and around the emitter region, a first collector region disposed in the base region adjacent to the emitter region through part of the base region, and a second collector region disposed outside the first collector region to surround the outside of the first collector region through part of the base region. The circuit comprises a first input means for applying a first input signal to the base of the transistor element, a second input means for applying a second input signal to the first collector of the transistor element, an output means derived from the second collector of the transistor element, and a bias means connected to the first collector for applying such a bias voltage that makes the transistor element operate in the saturation region. This analog operation circuit is afforded with an analog operation function by the utilization of the characteristics of such a lateral transistor, and has a simple circuit structure and a reduced number of circuit elements.

6 Claims, 4 Drawing Figures

ANALOG OPERATION CIRCUIT USING A MULTI-COLLECTOR LATERAL TRANSISTOR

BACKGROUND OF THE INVENTION

1. Field Of The Invention

This invention relates to an analog operation circuit, and more particularly to an analog operation circuit comprising a multi-collector lateral transistor.

2. Description Of The Prior Art

Such circuits as one shown in FIG. 3 have been known as an analog operation circuit. The circuit of FIG. 3 comprises a first differential amplifier comprising transistors $Q_3$ and $Q_4$, a second differential amplifier comprising transistors $Q_5$ and $Q_6$, and a third differential amplifier having a transistor $Q_7$ connected to the common emitter of the first differential amplifier and a transistor $Q_8$ connected to the common emitter of the second differential amplifier. Each one input terminal ($Q_4$ and $Q_5$) of said first and second differential amplifiers is connected in common to one terminal of a first input signal $V_{in1}$, and each other input terminal ($Q_3$ and $Q_6$) of said first and second differential amplifiers is connected in common to the other terminal of the first input signal $V_{in1}$. A second input signal $V_{in2}$ is applied commonly to the inputs of the third differential amplifier ($Q_7$ and $Q_8$). The total output ($V_{out1}$ and $V_{out2}$) is derived from the outputs of the first and second differential amplifiers.

The operation of this circuit can be described as follows.

The collector current $I_{c7}$ of the transistor $Q_7$ is varied by the input signal $V_{in2}$. This current $I_{c7}$ is further varied by the input signal $V_{in1}$. The output voltage $V_{out1}$ can be represented by the following formula.

$$V_{out1} = gm' \cdot V_{in1} \cdot V_{in2} \cdot R_4 \quad (1)$$

where, $gm'$ is the mutual conductance (transconductance) determined by the applied voltage and $R_4$ is the collector resistance. Thus, the circuit has an operation function.

The above circuit structure, however, apparently has such problems as that the circuit is complicated and the number of elements is large.

SUMMARY OF THE INVENTION

The present inventor has previously proposed a multi-collector lateral transistor as shown in FIG. 4 in which an emitter region is surrounded doubly by two collector regions for the purpose of minimizing the leakage current in the lateral transistor. This lateral transistor is disclosed in a Japanese Patent Application No. 50-27145, now Japanese Laid-Open Publication No. 51-102577 dated Sept. 10, 1976, in the name of the same assignee as that of this application. The important part of this invention is shown in FIG. 4, in which a current is allowed to flow through the second (auxiliary) collector $C_2$ in the range that the transistor utilizing the first (main) collector $C_1$ as the collector is in a region just before the saturation region to achieve the above-mentioned object. In FIG. 4, letter E denotes an emitter, and B a base electrode lead-out region. In a transition region between the active region and the saturation region of the first collector current, small variations in a bias voltage $V_{c1}$ of the first collector $C_1$ cause large variations in a current $I_{c2}$ of the second collector $C_2$. Thus, the present inventor has found that such a multi-collector lateral transistor operating in such a transition region has an analog operation function.

This invention has been made on the considerations of the above-mentioned facts.

Therefore, an object of this invention is to provide an analog operation circuit having a simple structure and a reduced number of circuit elements.

Another object of this invention is to provide an analog operation circuit which has high degree of integration and is relatively easy to manufacture.

According to an aspect of this invention, a first collector region is formed adjacent to an emitter region and at least one second collector region is formed to surround the outside of the first collector region in a lateral transistor element. A first input signal is applied to the base of the lateral transistor element, while a second input signal is applied to the first collector, and an output signal is derived from the second collector. The transistor utilizing the first collector as the collector is biased to operate in a region adjacent to the saturation region of the first collector current.

The above and other objects, features and advantages of this invention will become apparent from the following detailed description of the invention when taken in conjunction with the accompanying drawings.

BRIEF DESCRIPTION OF THE DRAWINGS

Throughout the drawings, similar numerals denote similar parts.

DESCRIPTION OF THE PREFERRED EMBODIMENT

Figure 1:
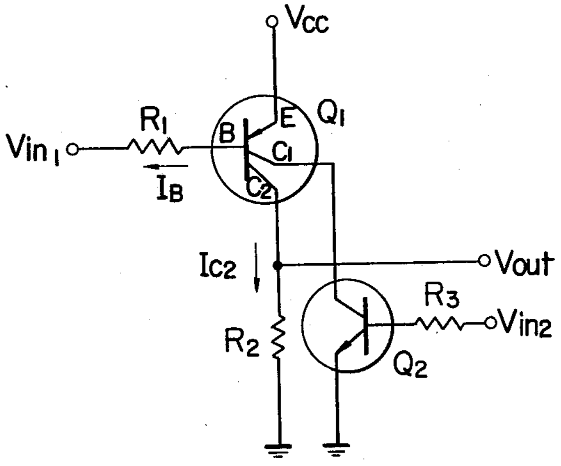
FIG. 1 is a circuit diagram of an analog operation circuit according to an embodiment of this invention.

Hereinbelow, description will be made in detail of the preferred embodiment referring to the drawings.

FIG. 1 shows an analog operation circuit according to an embodiment of this invention. This analog operation circuit includes a multi-collector lateral transistor $Q_1$ in which first and second collector regions are formed around an emitter E to surround it doubly or concentrically. A source voltage $V_{cc}$ is applied to the emitter E and a first input signal $V_{inl}$ is applied to the base B through a base resistance $R_1$. The first collector $C_1$ (which serves as the collector of the transistor in the normal operational state) is grounded through an input transistor $Q_2$. A second input signal $V_{in2}$ is applied to the base of the input transistor $Q_2$ through a base resistance $R_3$. The second collector $C_2$ of said lateral transistor $Q_1$ (which serves as the collector when said transistor $Q_1$ with the first collector $C_1$ is in the saturation region) is grounded through a resistance $R_2$. An output signal $V_{out}$ is derived from this second collector $C_2$. In this embodiment, biasing is arranged so that the transistor $Q_1$, utilizing the first collector $C_1$ as the collector, operates in the neighborhood of the saturation region.

Figure 2:
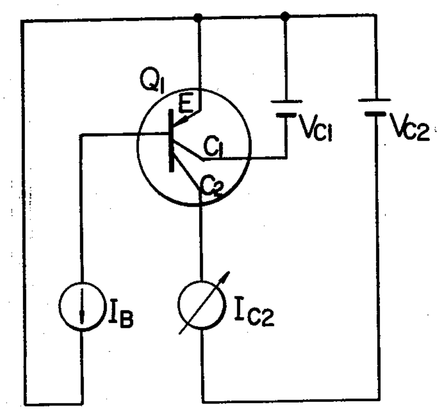
FIG. 2 is a circuit diagram for explaining the operation principles of the circuit of FIG. 1.

In the embodiment having the above structure, the aimed object can be achieved for the following reasons:

FIG. 2 is a circuit diagram for measuring the characteristics of the lateral transistor $Q_1$ to be used in the circuit of FIG. 1. The base current is denoted as $I_B$, the bias voltage for the first collector $C_1$ as $V_{cl}$, the bias voltage for the second collector $C_2$ as $V_{c2}$, and the current through the second collector $C_2$ as $I_{c2}$.

When the transistor $Q_1$ operates in the neighborhood of the saturation region, the second collector current $I_{c2}$ can be represented by $$I_{c2} = I_{c20} \cdot \gamma \cdot V_{cl} \quad (2),$$

where $I_{c20}$ is a current through the second collector $C_2$ and $\gamma$ is a constant represented in term of the inverse of the voltage $V_{c2}$. The current through the second collector $I_{c20}$ can be represented by $$I_{c20} = h_{FE} \cdot I_B \quad (3)$$

where $h_{FE}$ is the current amplification factor. Thus, combining equations (2) and (3), the following equation (4) is derived as $$I_{c2} = h_{FE} \cdot \gamma \cdot I_B \cdot V_{c1} \quad (4)$$

Namely, in an analog operation circuit using a lateral transistor element as shown in FIG. 2, when the first collector (bias) voltage, $V_{cl}$ is smaller in absolute value than the base-emitter voltage $V_{BE}$ for providing a certain base current $I_B$, the transistor utilizing the first collector $C_1$ as the collector is biased into the saturation state. In this state, a collector current $I_{c2}$ equal to $I_{c20}$ is allowed to pass through the second collector $C_2$. Next, when the first collector voltage $V_{cl}$ is made higher than the above-mentioned voltage $V_{BE}$, the transistor using the first collector $C_1$ as the collector is biased into the active region. Thus, the second collector current $I_{c2}$ flowing through the second collector $C_2$ becomes almost cut off. In this way, the second collector current $I_{c2}$ through the second collector $C_2$ can be controlled by varying the first collector voltage $V_{cl}$ applied to the first collector $C_1$.

Alternatively, the value of the first collector voltage $V_{cl}$ at which the transistor utilizing the first collector $C_1$ as the collector can be varied by changing the base current $I_B$. For example, when the base current $I_B$ is increased, the transistor utilizing the first collector $C_1$ as the collector is saturated at relatively high values of the first collector voltage $V_{cl}$. Thus, the second collector current $I_{c2}$ can also be controlled by the base current $I_B$. Then, it will be apparent that analog operation can be performed by appropriately changing the parameters of the base current $I_b$ and the biasing voltage $V_{cl}$ in equation (4).

Comparing the above embodiment with the above analysis, $V_{inl}$ corresponds to $I_B$, $V_{in2}$ to $V_{cl}$ and $V_{out}$ to $I_{c2}$ in equation (4). Substituting these values into equation (4) while setting $h_{FE} \cdot \gamma = K$, equation (5) is obtained as $$V_{out} = K \cdot V_{in1} \cdot V_{in2} \quad (5)$$

Thus, it can be seen that an operation circuit is provided.

In case where the signals $V_{in1}$ and $V_{in2}$ are in the form of sin $\omega t$, equation (5) becomes $$V_{out} = K \cdot \sin \omega t \cdot \sin \omega t \quad (6),$$

and hence $$V_{out} = K \cdot (1 + \cos 2\, \omega t/2) \quad (7)$$

where $\omega$ is the angular frequency and $t$ variable. The frequency is doubled as a result of the operation.

Figure 3:
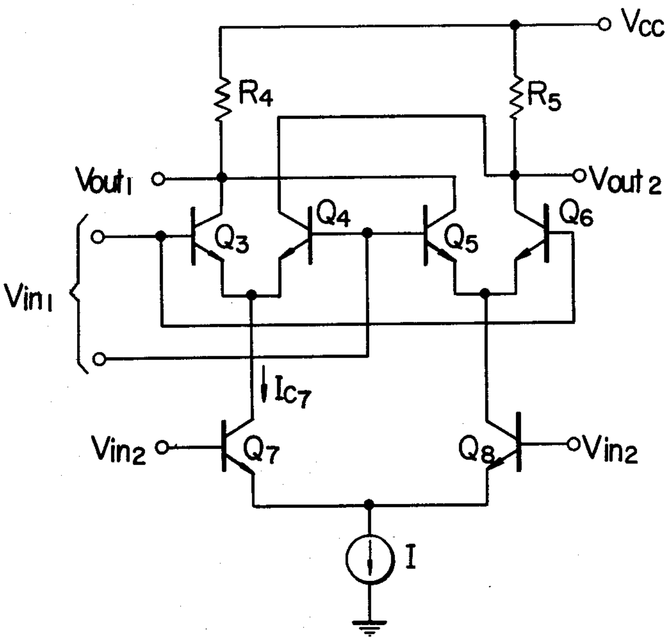
F I G. 3 PRIOR ART
FIG. 3 is a circuit diagram of a conventional analog operation circuit.
Figure 4:
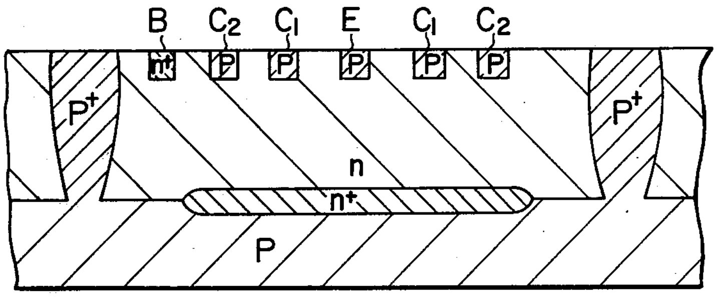
FIG. 4 is a cross-section of important part of a lateral transistor structure on which this invention is based.

As in apparent from the foregoing description, characteristics of a lateral transistor are utilized to provide operation function in this invention. Thus, the present analog operation circuit has a very simple structure and a reduced number of circuit elements or components, and reduces the area occupied on a semi-conductor substrate to about one third of the area compared with conventional circuits especially as shown in FIG. 3.

It is apparent that this invention is not limited to the above embodiment, but can be adapted and altered in various modifications.

For example, although an output signal is derived from a second collector in the above embodiment, by making the second collector $C_2$ for example in a segmented circular form, whose segmented regions form plural collectors, the number of collectors may be increased and a plurality of outputs may be derived therefrom.

Further, although a bipolar transistor $Q_2$ is used as the input transistor in the embodiment, another type of transistor such as an insulated gate type field effect transistor (MIS FET) may be used.

What is claimed is:

1. An analog operation circuit comprising:

a lateral transistor element having an emitter region having an emitter electrode, a base region having a base electrode, a first collector region having a first collector electrode and formed between said emitter region and part of said base region, and a second collector region having a second collector electrode and formed outside the first collector region between the outside of said first collector region and part of said base region, said emitter electrode being supplied with an operating voltage;

means for applying a first input signal to the base electrode of said lateral transistor;

means for applying a second input signal to the first collector electrode of said lateral transistor;

output means for deriving an output signal from the second collector electrode of said lateral transistor; and biasing means for biasing the lateral transistor element using said first collector electrode as its sole collector to operatein the transition region between the active region and the saturation region of its operating characteristics.

2. An analog operation circuit according to claim 1, in which said biasing means includes a transistor means connected between said second input signal applying means and a reference potential and having a control electrode supplied with the second input signal to provide a bias voltage in accordance with the applied second input signal.

3. An analog operation circuit according to claim 1, further comprising an input resistor connected to the base electrode of said lateral transistor element and an output load connected between the second collector electrode of said lateral transistor element and a reference potential.

4. An analog operational circuit formed in a semiconductor substrate comprising:

a multi-collector lateral transistor having an emitter region, a base region, at least two separate collector regions disposed between said emitter region and said base region so as to surround one collector region nearer to the emitter region by the other collector region, said emitter region being supplied with an operating voltage;

input means connected to the base region of said transistor for supplying a first input signal thereto;

bias voltage means connected to said one collector region of the transistor for applying a bias voltage depending upon a second input signal thereto; and output means connected to said the other collector region of the transistor for providing an output signal;

the bias voltage being such that a transistor comprising said one collector region as its sole collector may operate in a transition region between an active and a saturation region of its operation characteristics.

5. The analog operational circuit according to claim 4, in which said two separate collector regions are of circular or ring shape and are formed concentrically of said emitter region.

6. The analog operational circuit according to claim 4, in which said other collector region has a segmented circular form, said segmented regions constituting a plurality of output collectors is said transistor.

* * * * *